United States Patent
Wright

(10) Patent No.: US 8,280,060 B1
(45) Date of Patent: Oct. 2, 2012

(54) SECURE WIRELESS TRANSMISSION

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 961 days.

(21) Appl. No.: 12/075,748

(22) Filed: Mar. 12, 2008

Related U.S. Application Data

(60) Provisional application No. 60/906,605, filed on Mar. 12, 2007.

(51) Int. Cl.
*G06F 21/00* (2006.01)

(52) U.S. Cl. .................................................. 380/285

(58) Field of Classification Search ............ 380/285
See application file for complete search history.

(56) References Cited

U.S. PATENT DOCUMENTS

| | | | |
|---|---|---|---|
| 5,006,974 A | 4/1991 | Kazerounian et al. |
| 5,014,097 A | 5/1991 | Kazerounian et al. |
| 5,163,146 A | 11/1992 | Antanaitis, Jr. et al. |
| 5,336,986 A | 8/1994 | Allman |
| 5,376,834 A | 12/1994 | Carobolante |
| 5,444,412 A | 8/1995 | Kowalski |
| 5,546,568 A | 8/1996 | Bland et al. |
| 5,744,944 A | 4/1998 | Danstrom |
| 5,925,110 A | 7/1999 | Klein |
| 6,177,785 B1 | 1/2001 | Lee |
| 6,182,163 B1 | 1/2001 | Yamashita et al. |
| 6,195,712 B1 | 2/2001 | Pawlowski et al. |
| 6,330,231 B1 | 12/2001 | Bi |
| 6,366,224 B2 | 4/2002 | Cliff et al. |
| RE37,708 E | 5/2002 | Danstrom |
| 6,509,845 B1 | 1/2003 | Tanaka |
| 6,912,605 B1 * | 6/2005 | Wright ............................. 710/60 |
| 6,924,790 B1 | 8/2005 | Bi |
| 7,071,664 B1 | 7/2006 | Teggatz et al. |
| 7,089,434 B2 | 8/2006 | Kuo |
| 7,142,009 B1 | 11/2006 | Watt et al. |
| 7,231,530 B1 | 6/2007 | Miller et al. |
| 7,382,676 B2 | 6/2008 | Ballweber et al. |
| 7,385,418 B2 | 6/2008 | Speers et al. |
| 7,392,409 B2 | 6/2008 | Tateyama |
| 7,392,447 B2 | 6/2008 | Tang et al. |
| 7,415,624 B2 | 8/2008 | Miller et al. |
| 7,589,584 B1 | 9/2009 | Bui |
| 7,619,402 B1 | 11/2009 | Kwong |
| 7,626,576 B2 | 12/2009 | Anandakumar et al. |
| 7,672,258 B1 | 3/2010 | Wu et al. |
| 7,710,939 B2 | 5/2010 | Shao et al. |
| 7,739,529 B2 | 6/2010 | Hardman et al. |

(Continued)

OTHER PUBLICATIONS

NNRD41693. "Method for Asserting Lowest Computer Power Level." IBM Research Disclosure, UK. Dec. 1998. vol. 41, Issue 416. 3 pages.

(Continued)

*Primary Examiner* — Michael S McNally

(57) ABSTRACT

A method in accordance with one embodiment of the invention can include receiving a request for a public key from a local node. Furthermore, the public key and a private key that corresponds to the public key can be generated. The public key can be sent to the local node. An encrypted session key can be received from the local node. The encrypted session key can be decrypted using the private key. Additionally, the decrypted session key can be sent to the local node that enables the local node to have secure wireless communication with a remote node. The remote node can generate the encrypted session key using the public key.

18 Claims, 4 Drawing Sheets

U.S. PATENT DOCUMENTS

| | | | |
|---|---|---|---|
| 7,844,308 | B2 | 11/2010 | Rhee et al. |
| 8,060,767 | B1 | 11/2011 | Wright |
| 8,108,529 | B1 | 1/2012 | Wright |
| 2002/0080967 | A1* | 6/2002 | Abdo et al. .................... 380/270 |
| 2003/0031320 | A1* | 2/2003 | Fan et al. ...................... 380/255 |
| 2003/0120922 | A1 | 6/2003 | Sun et al. |
| 2004/0029621 | A1 | 2/2004 | Karaoguz et al. |
| 2004/0088630 | A1 | 5/2004 | Arima et al. |
| 2004/0218762 | A1* | 11/2004 | Le Saint et al. ............... 380/277 |
| 2005/0052437 | A1 | 3/2005 | Hudson |
| 2005/0074051 | A1 | 4/2005 | Won et al. |
| 2005/0093572 | A1 | 5/2005 | Sun et al. |
| 2005/0195664 | A1 | 9/2005 | Ooishi |
| 2005/0243059 | A1* | 11/2005 | Morris et al. .................. 345/158 |
| 2006/0035590 | A1 | 2/2006 | Morris et al. |
| 2006/0095802 | A1 | 5/2006 | Dhong et al. |
| 2007/0147381 | A1 | 6/2007 | Wilhelm |
| 2007/0263872 | A1* | 11/2007 | Kirkup et al. ................. 380/273 |
| 2008/0071972 | A1 | 3/2008 | Kimura |

OTHER PUBLICATIONS

NN9502259. "Power Management Method for Portable Personal Computer with Modem." IBM Technical Disclosure Bulletin. Feb. 1995, US. vol. 38, Issue 2. 2 pages.

NN9010237. "Interface of a Low-Power Keyboard for Lap-Top Computers." IBM Technical Disclosure Bulletin. Oct. 1990, US. vol. 33, Issue 5. 3 pages.

USPTO Non-Final Rejection, U.S. Appl. No. 12/075,633, dated Apr. 26, 2010, 25 pages.

USPTO Final Rejection, U.S. Appl. No. 12/075,633, dated Nov. 24, 2010, 24 pages.

USPTO Non-Final Rejection, U.S. Appl. No. 12/075,633, dated Feb. 22, 2011, 25 pages.

USPTO Final Rejection, U.S. Appl. No. 12/075,633, dated Aug. 4, 2011, 47 pages.

USPTO Notice of Allowance, U.S. Appl. No. 12/075,633, dated Nov. 7, 2011, 31 pages.

U.S. Appl. No. 12/075,633 "Encoded Acknowledge Signal for Wireless Communication" filed Mar. 12, 2008; 28 pages.

Unpublished U.S. Appl. No. 12/005,768, filed Dec. 27, 2007, the parent application to this contiuation application.

USPTO Non Final Rejection for U.S. Appl. No. 12/075,633 dated Apr. 26, 2010; 11 pages.

* cited by examiner

SECURE WIRELESS TRANSMISSION

CROSS-REFERENCE TO RELATED APPLICATIONS

This patent application claims the benefit of the U.S. Provisional Patent Application No. 60/906,605 entitled "Programmable Intelligent Integrated Circuits", by David Wright et al., filed Mar. 12, 2007, which is hereby incorporated by reference in its entirety.

BACKGROUND

Conventional wireless peripheral communication protocols typically do not support encryption. Wireless keyboard communication, for example, to a host device is generally done in the clear. Most wireless communication circuitry used in keyboard conductivity is not sophisticated enough to provide public key/private key encryption. Those wireless keyboards that do support encryption usually use a shared secret based encryption. For example, during manufacturing, the secret key is permanently installed into both the wireless keyboard and the wireless receiver. However, one of the disadvantages with such an approach is that the wireless keyboard cannot be replaced independently of the wireless receiver. Such is a particular problem if the wireless receiver is built into a computer. Alternatively, in another technique, one device transmits the secret in the clear to another device during a wireless "binding" process, which can happen in the field. However, in the clear transmission of the secret is not an acceptable solution for some applications that demand better protection.

Yet another technique for enabling encryption that is made available in some wireless keyboards, but is seldom used, is a mode where a computer may instruct a user to type some long alphanumeric sequence key into the keyboard with no visual feedback so that the key is not transmitted over the air. However, one problem with this technique is how unfriendly it is for the user.

Currently there are Bluetooth® wireless keyboards and wireless receivers that are able to perform encryption. Specifically, in order to perform the encryption, the Bluetooth® wireless keyboard and its corresponding wireless receiver are each usually implemented with a 32-bit processor. However, such a type of implementation is not cost effective and also results in poor battery life for the Bluetooth® wireless keyboard.

SUMMARY

A method in accordance with one embodiment of the invention can include receiving a request for a public key from a local node. Furthermore, the public key and a private key that corresponds to the public key can be generated. The public key can be sent to the local node. An encrypted session key can be received from the local node. The encrypted session key can be decrypted using the private key. Additionally, the decrypted session key can be sent to the local node that enables the local node to have secure wireless communication with a remote node. The remote node can generate the encrypted session key using the public key.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "transmitting", "generating", "decrypting", "encrypting", "receiving", "determining", "sending", "changing", "switching", "binding", "storing", "executing", "setting", "programming", "utilizing", "producing", "completing", "outputting", or the like, can refer to the actions and processes of a processor(s) and/or electrical components, an electronic and/or electrical computing device, but is not limited to such. The computing device can manipulate and transform data represented as physical (electronic) quantities within the computing device's registers and/or memories into other data similarly represented as physical quantities within the computing device memories and/or registers or other such information storage or transmission.

Figure 1:
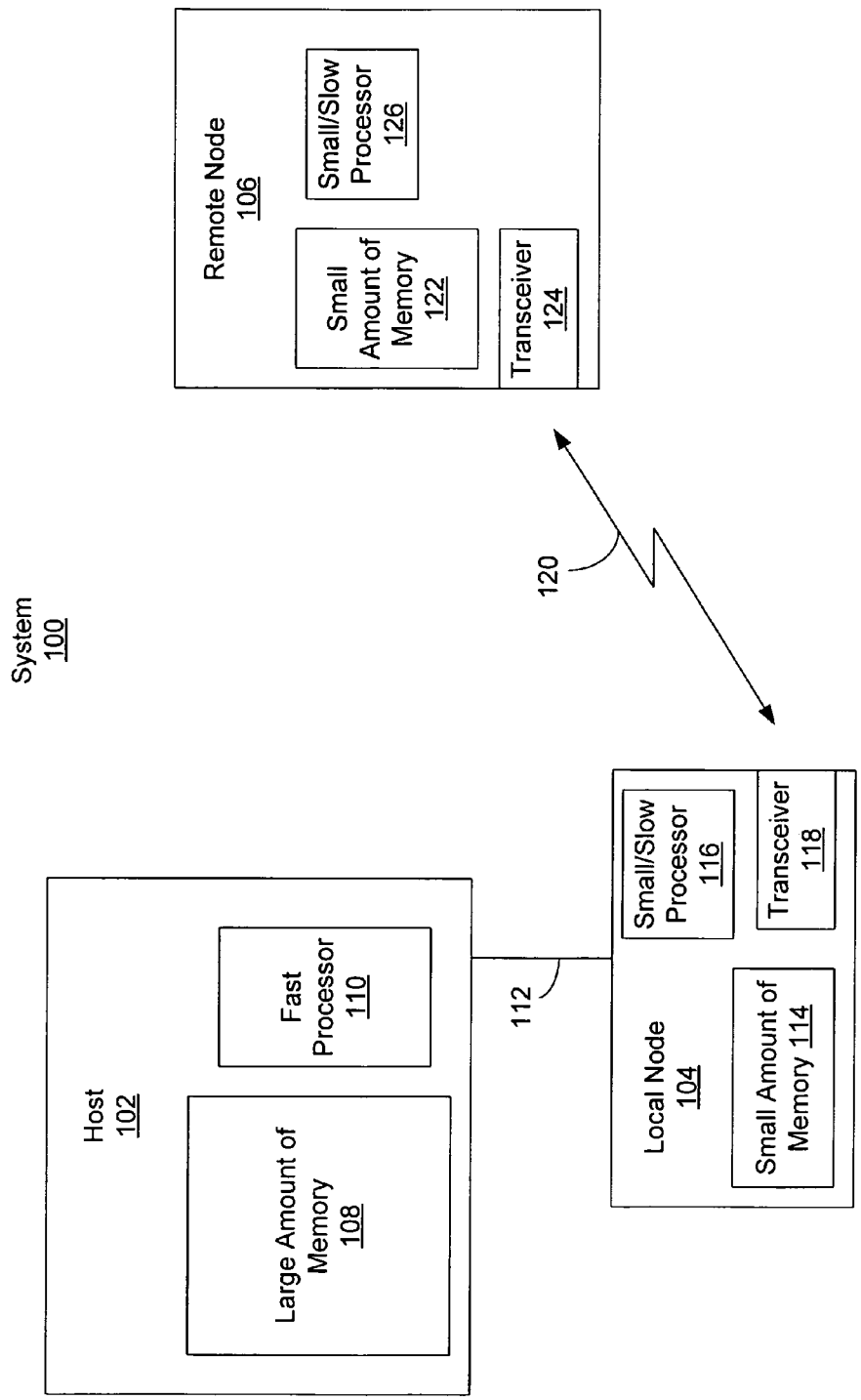
FIG. 1 is a block diagram of an exemplary system in accordance with various embodiments of the invention.

FIG. 1 is a block diagram of an exemplary system 100 in accordance with various embodiments of the invention. Specifically, the system 100 can enable secure transmission of a secret key or data between a remote node or peripheral 106 and a host system 102 for wireless encryption. The secret is then used for encrypted communication between the peripheral 106 and the host 102. It is noted that in one embodiment, the local communication device 104 may not be sophisticated enough to perform public key/private key computations, but the host device 102 can perform these tasks on behalf of the local communication device 104. As such, the local communication device 104 can request that the host 102 perform certain encryption functionality.

System 100 can include, but is not limited to, the host system or device 102, the local node or communication device 104, and the remote node or peripheral 106. It is noted that in one embodiment, the local node 104 can be implemented as a separate device or apparatus that can be coupled to the host 102 (via communication interface 112). In an embodiment, the local node 104 can be incorporated as part of the host 102. The host 102 can include, but is not limited to, any suitable type of fast or powerful processor 110, and a large amount of any suitable type of memory 108, which can be coupled together (not shown) in a wide variety of ways known to those of ordinary skill in the art. Note that the host 102 can be implemented in a wide variety of ways, as will be recognized by skilled artisans. For example, the host 102 can be implemented as, but is not limited to, a computer system, a portable computing device, a set-top box, a television, a computing device, a laptop computer, or any other suitable type of computer or computing device, system, or apparatus.

Within FIG. 1, the local node 104 can include, but is not limited to, any suitable type of small and/or slow processor 116, a small amount of any suitable type of memory 114, and a transceiver 118, which can be coupled together (not shown) in a wide variety of ways known to those of ordinary skill in the art. For example, in one embodiment, the local node 104 can be implemented as, but is not limited to, a single-chip 2.4 GHz RF transceiver with integrated 8-bit CPU, 1 kByte RAM, 8 kB Flash Memory and USB interface. The transceiver 118 can be implemented in a wide variety of ways, as will be recognized by skilled artisans. For example, the transceiver 118 can be implemented as, but is not limited to, a radio frequency (RF) transceiver, an infrared transceiver, a Bluetooth® transceiver, or any other suitable type of wireless transceiver. It is noted that the local node 104 and the host 102 are coupled via a communication interface 112. In addition, the elements of the host 102 and the elements of the local node 104 can each be coupled to utilize (not shown) the communication interface 112. The communication interface 112 can be implemented in a wide variety of ways known to skilled artisans. For example, the communication interface 112 can be implemented as, but is not limited to, a Universal Serial Bus (USB), a USB interface, serial communication interface, an Ethernet interface, a FireWire (IEEE 1394) interface, a parallel communication interface, a serial port (RS232) interface, and a small computer system interface (SCSI) bus interface. Thus, according to an exemplary embodiment of the present invention, the communication interface 112 can comprise any suitable type of wired communication link or connection. However, according to an alternative exemplary embodiment, the communication interface 112 can comprise any suitable type of wireless communication link or connection.

Within system 100, the remote node 106 can include, but is not limited to, a wireless transceiver 124, a small amount of any suitable type of memory 122, and any suitable type of a small and/or slow processor 126, which can be coupled together (not shown) in a wide variety of ways, as will be recognized by skilled artisans. It is pointed out that the remote node 106 can be implemented in a wide variety of ways, as would be understood by those of ordinary skill in the art. For example, in one embodiment, the remote node 106 can be implemented as a wireless keyboard or other suitable type of wireless device or apparatus, although exemplary embodiments of the present invention are not limited to such. Skilled artisans will recognize that the transceiver 124 of the remote node 106 can be implemented in a wide variety of ways. For example, the transceiver 124 can be implemented as, but is not limited to, a radio frequency (RF) transceiver, an infrared transceiver, a Bluetooth® transceiver, or any other suitable type of wireless transceiver or communication device. It is noted that the remote node 106 and the local node 104 are configured or otherwise adapted to wirelessly communicate (as indicated by double headed arrow 120) utilizing transceivers 124 and 118, respectively. The wireless communication 120 can be implemented using any suitable type of wireless communication protocol. For example, the wireless communication 120 can utilize, but is not limited to, any radio frequency communication protocol, any infrared communication protocol, the Bluetooth® communication protocol, or any other suitable type of wireless communication protocol. However, according to an alternative exemplary embodiment of the present invention, the local node 104 and the remote node 106 can communicate using any suitable type of wired communication link or connection.

Within FIG. 1, system 100 can operate in a wide variety of ways. For example in an embodiment, a binding process can initially take place that includes the host 102, the local node 104, and the remote node 106. The binding process enables the host 102, the local node 104, and the remote node 106 to establish communication, and such a binding process can begin by the press of a button or some other suitable technique (whether manual or automatic) that is capable of initiating the binding. During the binding process, the remote node 106 can wirelessly transmit (via transceiver 124) a request for a public key to the local node 104. In one embodiment, upon, for example, waking up from a low power state or sleep mode, the remote node 106 can wirelessly transmit (via transceiver 124) a request for a public key to the local node 104. Once the local node 104 wirelessly receives the public key request (via transceiver 118), the local node 104 can send the public key request to the host 102 via communication interface 112. Upon receipt of the public key request, the host 102 can generate a private key and a public key in any suitable manner, wherein the private key corresponds to the public key, and vice versa. The host 102 can then transmit the public key to the local node 104 via communication interface 112. The local node 104 can then transmit wirelessly (via transceiver 118) the public key to the remote node 106.

Additionally, the local node 104 can then transmit wirelessly (via transceiver 118) a request for the remote node 106 to generate a secret (e.g., one or more session keys or other suitable type of secret). Upon receipt of the request via transceiver 124, the remote node 106 can generate the secret and encrypt it using the previously received public key. The remote node 106 can then transmit wirelessly (via transceiver 124) the encrypted secret (e.g., session key) to the local node 104. The local node 104 can send the encrypted secret (via communication interface 112) to the host 102 which decrypts it using the previously generated private key corresponding to the previously transmitted public key. The host 102 can then send the decrypted secret key over communication interface 112 to the local node 104. At this point, the secret (e.g., one or more session keys or the like) is shared between the remote node 106 and the local node 104, and it can be utilized for secure communication (e.g., encrypted keystrokes or the like) between these two devices. In is noted that in one embodiment, the secret used between the local node 104 and the remote node 106 is not transmitted wirelessly in the clear. It is pointed out that in an embodiment, one or more of the operations described herein with reference to the host 102 can be performed by, but is not limited to, a device driver or a filter driver operating on the host 102. In one embodiment, the filter driver (or device driver) can be operating (or located) immediately above or immediately below or otherwise in connection with a driver that handles Human Interface Devices (HID), e.g., a USB HID (e.g., the Windows HIDUSB.sys driver) driver, and/or a driver that handles Keyboard signals (e.g., the Windows KDBHID.sys driver), which is operating on the host 102. In an embodiment, the filter driver (or device driver) can be operating (or located) above or below or otherwise in connection with a driver that handles HID, which is operating on the host 102.

Within FIG. 1, it is understood that the system 100 may not include all of the elements illustrated by FIG. 1. Additionally, the system 100 can be implemented to include one or more elements not illustrated by FIG. 1.

Figure 2:
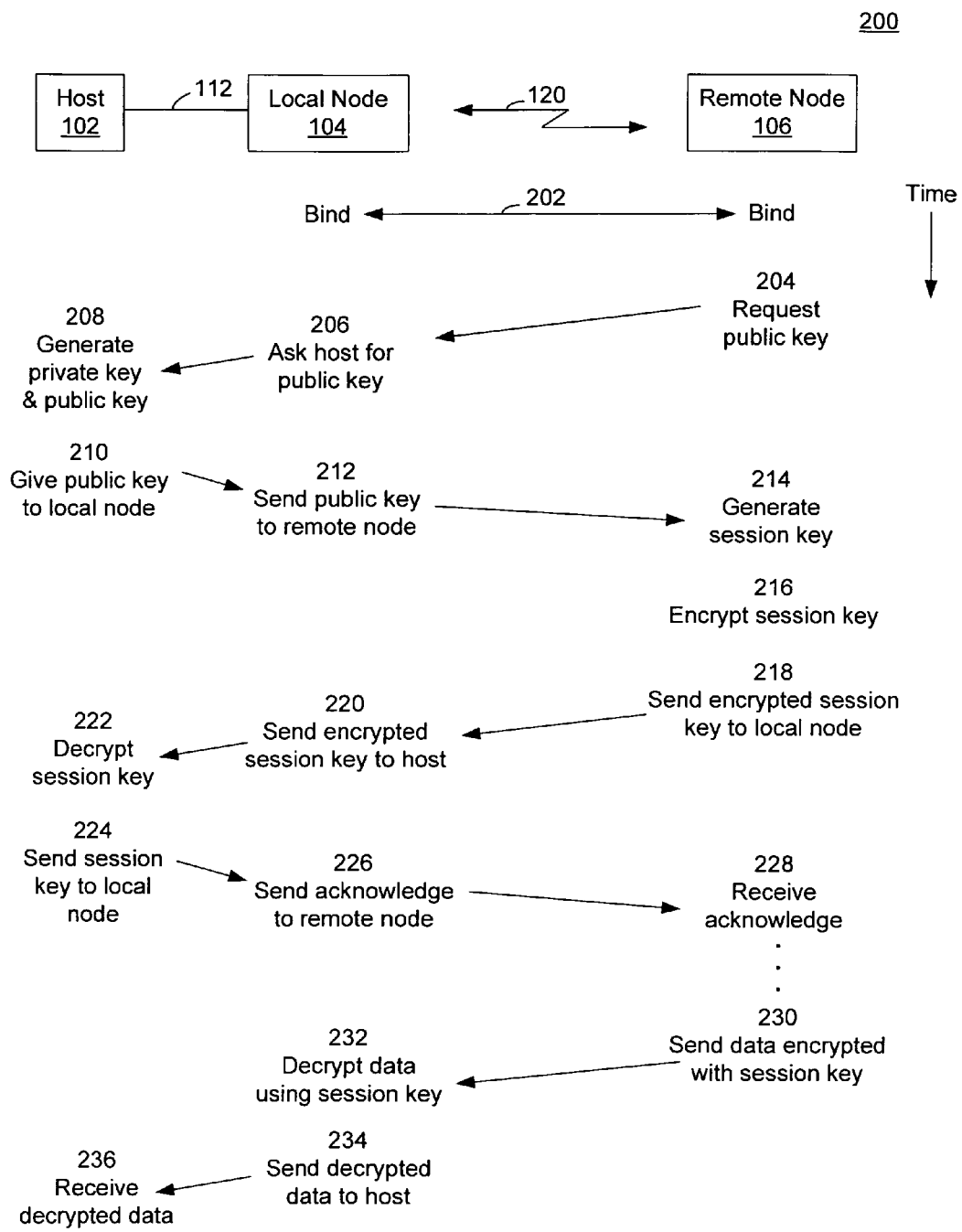
FIG. 2 is an exemplary flow diagram in accordance with various embodiments of the invention.

FIG. 2 is an exemplary flow diagram 200 in accordance with various embodiments of the present invention. Note that FIGS. 1 and 2 will be discussed together in order to provide a more complete understanding of various embodiments of the invention. Within FIG. 2, at the beginning of this example, the local node 104 and the remote node 106 can be involved in a binding process (as indicated by double headed arrow 202). In one embodiment, the binding process 202 could have occurred at a previous time and the example can begin, for example, when the remote node 106 awakens from a low power state or sleep mode or in response to any suitable type of event (e.g., after a predetermined length or period of time). At 204, the remote node 106 wirelessly transmits a request for a public key to the local node 104. At 206, the local node 104 can wirelessly receive the request and send the request for a public key to the host 102 (e.g., via a wired communication link, such as, for example, communication interface 112). At 208, upon receipt of the request, the host 102 can generate a private key and a public key for use in encrypted communication. At 210, the host 102 can give or otherwise transmit the public key to the local node 104. At 212, the local node 104 can receive the public key and send or otherwise transmit it wirelessly to the remote node 106. At 214, the remote node 106 can receive the public key and can generate a secret or session key or the like. Note that in one embodiment, the secret or session key can comprise, for example, a randomly generated 56-bit, 128-bit, 192-bit or 256-bit number, although exemplary embodiments of the present invention are not limited to such.

At 216, the remote node 106 can encrypt the secret or session key utilizing the public key, using a public key cryptographic algorithm. It is pointed out that such encryption is within the capability of many small CPUs (or processors) with a small amount of Flash and RAM, such as 8-bit MCUs with 1 kB RAM and 8 kB Flash, whereas the corresponding decryption algorithm is not within the capability of such CPUs (or processors). At 218, the remote node 106 can send or transmit wirelessly the encrypted secret or session key to the local node 104. At 220, the local node 104 can wirelessly receive the encrypted secret or session key and can send or otherwise transmit it to the host 102. At 222, the host 102 can decrypt the encrypted secret or session key utilizing the private key, which corresponds to the public key. At 224, the host 102 can send or transmit the decrypted secret or session key to the local node 104. According to an exemplary embodiment, at 226, upon receipt of the decrypted secret or session key, the local node 104 can wirelessly transmit an acknowledge (or confirmation) message to the remote node 106. Note that the acknowledge (or confirmation) message can be configured to indicate to the remote node 106 that the local node 104 has received the secret or session key and is ready for encrypted communication using it. According to the exemplary embodiment, at 228, the remote node 106 can wirelessly receive the acknowledge (or confirmation) message from the local node 104. Subsequently, at 230, the remote node 106 can wirelessly send or otherwise transmit data encrypted with the secret or session key to the local node 104 using a shared-secret encryption algorithm, including but not limited to, DES (Data Encryption Standard), Triple Data Encryption Standard (Triple-DES or 3DES or TDES), or AES (Advanced Encryption Standard). For example, at 232, the local node 104 can wirelessly receive the encrypted data, and then the local node 104 can decrypt the encrypted data utilizing the secret or session key. At 234, the local node 104 can send or otherwise output the decrypted data to the host 102. At 236, the host 102 can receive the decrypted data from the local node 104.

Within FIG. 2, it is noted that any of the operations described with reference to flow diagram 200 can be implemented in a wide variety of ways. For example, any of the operations described with reference to flow diagram 200 can be implemented in any manner similar to that described herein, but are not limited to such.

Figure 3A:
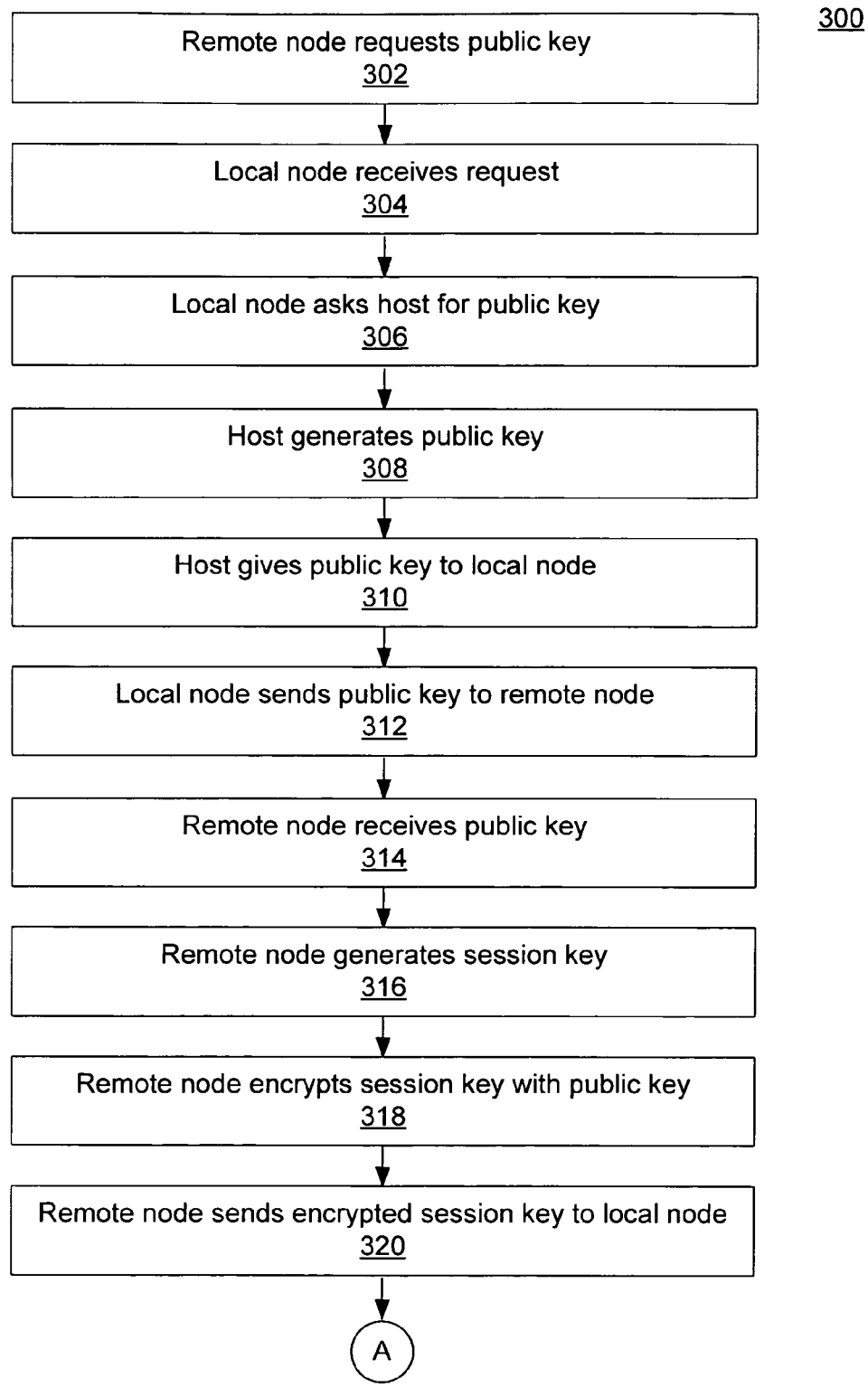
FIGS. 3A and 3B are a flow diagram of an exemplary method in accordance with various embodiments of the invention.
Figure 3B:
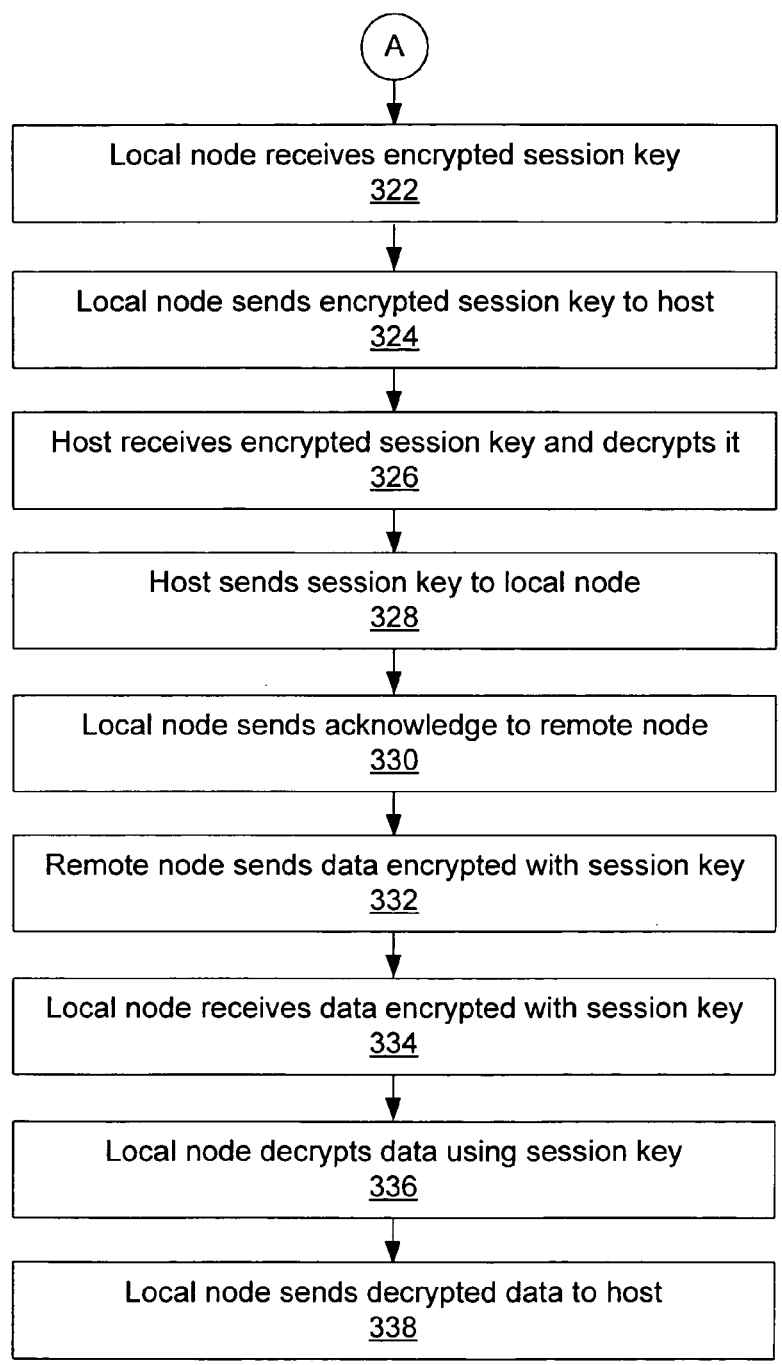

FIGS. 3A and 3B are a flow diagram of a method 300 in accordance with various embodiments of the invention for establishing a secure wireless transmission between a remote node and a host. Method 300 includes exemplary processes of various embodiments of the invention which can be carried out by any suitable type of processor(s) and/or electrical components under the control of computing device readable and executable instructions (or code), e.g., software. The computing device readable and executable instructions (or code) may reside, for example, in any appropriate type of data storage features, such as volatile memory, non-volatile memory and/or mass data storage that are usable by a computing device. However, the computing device readable and executable instructions (or code) may reside in or be stored by any type of computing device readable medium. Although specific operations are disclosed in method 300, such operations are exemplary. Method 300 may not include all of the operations illustrated by FIGS. 3A and 3B. Also, method 300 may include various other operations and/or variations of the operations shown by FIGS. 3A and 3B. Likewise, the sequence of the operations of method 300 can be modified. It is noted that the operations of method 300 can be performed by software, by firmware, by electronic hardware, by electrical hardware, or by any suitable combination thereof.

Specifically, method 300 can include a remote node that wirelessly transmits to a local node a request for a public key for enabling encrypted communication. The local node can receive the request from the remote node. The local node can query a host for a public key. The host can receive the public key query and can generate a public key of a public key/private key pair. The host can communicate the public key to the local node. The local node can wirelessly send the received public key to the remote node. The remote node can receive the public key from the local node. The remote node can generate a session key. The remote node can encrypt the session key with the received public key. The remote node can wirelessly send the encrypted session key to the local node. The local node can receive the encrypted session key from the remote node. The local node can send the encrypted session key to the host. The host can receive the encrypted session key from the local node and can decrypt the session key (e.g., using the corresponding private key). The host can send the decrypted session key to the local node. After receiving the decrypted session key, the local node can wirelessly send, for example, an acknowledge message or other suitable indication to the remote node thereby notifying the remote node that it successfully received the session key and is currently ready to receive or otherwise participate in encrypted communication. Subsequently, the remote node can wirelessly send data that has been encrypted with the session key to the local node. The local node can receive the data encrypted using the session key. The local node can decrypt the received data using the session key. The local node can send the decrypted data to the local host. In this manner, secure wireless communication can be established between a remote node and a host, as well as between the local and remote nodes.

At operation 302 of FIG. 3A, a remote node (e.g., remote node 106) can wirelessly transmit (e.g., via 120) to a local node (e.g., local node 104) a request for a public key for enabling encrypted communication. Note that operation 302 can be implemented in a wide variety of ways, as will be recognized by those of ordinary skill in the art. For example, operation 302 can be implemented in any suitable manner similar to that described herein, but is not limited to such.

At operation 304, the local node can receive the request from the remote node. Skilled artisans will recognize that operation 304 can be implemented in a wide variety of ways. For example, operation 304 can be implemented in any appropriate manner similar to that described herein, but is not limited to such.

At operation 306 of FIG. 3A, the local node can ask or query a host (e.g., host 102) for a public key. It is noted that operation 306 can be implemented in a wide variety of ways, as will be recognized by one of ordinary skill. For example, operation 306 can be implemented in any suitable manner similar to that described herein, but is not limited to such.

At operation 308, the host can receive the public key query and can generate a public key and a corresponding private key. As skilled artisans will recognize, operation 308 can be implemented in a wide variety of ways. For example, operation 308 can be implemented in any suitable manner similar to that described herein, but is not limited to such.

At operation 310 of FIG. 3A, the host can communicate the public key to the local node. It is pointed out that that operation 310 can be implemented in a wide variety of ways known to those of ordinary skill in the art. For example, operation 310 can be implemented in any appropriate manner similar to that described herein, but is not limited to such.

At operation 312, the local node can wirelessly send the received public key to the remote node. It is noted that operation 312 can be implemented in a wide variety of ways, as will be recognized by skilled artisans. For example, operation 312 can be implemented in any suitable manner similar to that described herein, but is not limited to such.

At operation 314 of FIG. 3A, the remote node can receive the public key from the local node. As those of ordinary skill will recognize, operation 314 can be implemented in a wide variety of ways. For example, operation 314 can be implemented in any appropriate manner similar to that described herein, but is not limited to such. At the completion of operation 314, process 300 can be exited.

At operation 316, the remote node can generate a suitable session key or the like. It is pointed out that operation 316 can be implemented in a wide variety of ways known to skilled artisans. For example, operation 316 can be implemented in any suitable manner similar to that described herein, but is not limited to such.

At operation 318 of FIG. 3A, the remote node can encrypt the session key with the received public key. Skilled artisans will recognize that operation 318 can be implemented in a wide variety of ways. For example, operation 318 can be implemented in any appropriate manner similar to that described herein, but is not limited to such.

At operation 320, the remote node can wirelessly send the encrypted session key to the local node. Note operation 320 can be implemented in a wide variety of ways, as will be recognized by those of ordinary skill in the art. For example, operation 320 can be implemented in any suitable manner similar to that described herein, but is not limited to such.

At operation 322 of FIG. 3B, the local node can receive the encrypted session key from the remote node. It is pointed out that that operation 322 can be implemented in a wide variety of ways known to those of ordinary skill. For example, operation 322 can be implemented in any appropriate manner similar to that described herein, but is not limited to such.

At operation 324, the local node can send the encrypted session key to the host. As will be recognized by skilled artisans, operation 324 can be implemented in a wide variety of ways. For example, operation 324 can be implemented in any suitable manner similar to that described herein, but is not limited to such.

At operation 326 of FIG. 3B, the host can receive the encrypted session key from the local node and can decrypt the session key using the previously generated private key corresponding to the public key transmitted to the local node at operation 310. Note that operation 326 can be implemented in a wide variety of ways, as skilled artisans will recognize. For example, operation 326 can be implemented in any appropriate manner similar to that described herein, but is not limited to such.

At operation 328, the host can send the decrypted session key to the local node. As those of ordinary skill will recognize, operation 328 can be implemented in a wide variety of ways. For example, operation 328 can be implemented in any suitable manner similar to that described herein, but is not limited to such.

At operation 330 of FIG. 3B, after receiving the decrypted session key, the local node can wirelessly send an acknowledge message to the remote node thereby notifying the remote node that it successfully received the session key and is currently ready to receive or otherwise conduct encrypted communication. It is pointed out that that operation 330 can be implemented in a wide variety of ways known to those of ordinary skill in the art. For example, operation 330 can be implemented in any appropriate manner similar to that described herein, but is not limited to such.

At operation 332, subsequently, the remote node can wirelessly send data that has been encrypted with the session key to the local node. Skilled artisans will understand that operation 332 can be implemented in a wide variety of ways. For example, operation 332 can be implemented in any suitable manner similar to that described herein, but is not limited to such.

At operation 334 of FIG. 3B, the local node can receive the data encrypted using the session key. It is pointed out that operation 334 can be implemented in a wide variety of ways as will be recognized by those of ordinary skill in the art. For example, operation 344 can be implemented in any appropriate manner similar to that described herein, but is not limited to such.

At operation 336, the local node can decrypt the received data using the session key. As skilled artisans will recognize, operation 336 can be implemented in a wide variety of ways. For example, operation 336 can be implemented in any suitable manner similar to that described herein, but is not limited to such.

At operation 338 of FIG. 3B, the local node can send the decrypted data to the local host. It is pointed out that that operation 338 can be implemented in a wide variety of ways known to those of ordinary skill in the art. For example, operation 338 can be implemented in any appropriate manner similar to that described herein, but is not limited to such. At the completion of operation 338, process 300 can be exited.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
generating at a host a public key and a private key that corresponds to the public key in response to a request for the public key from a local node;
sending the public key from the host to the local node;
receiving at the host an encrypted session key from the local node;
decrypting the encrypted session key at the host using the private key; and
sending the decrypted session key from the host to the local node that enables the local node to have encrypted wireless communication with a remote node, wherein the remote node comprises a wireless keyboard.

2. The method of claim 1, wherein the local node is coupled to the host system via a wired connection.

3. The method of claim 1, wherein the local node comprises a wireless transceiver and the local node is coupled to the host system via Universal Serial Bus interface.

4. The method of claim 1, further comprising:
wirelessly transmitting a the public key from the local node to the remote node.

5. The method of claim 4, further comprising:
generating the encrypted session key at the remote node.

6. The method of claim 4, further comprising:
wirelessly transmitting the encrypted session key from the remote node to the local node, wherein the encrypted session key was encrypted using the public key.

7. A system comprising:
a host configured to generate a public key and a corresponding private key;
a local node coupled to the host and configured to wirelessly transmit the public key; and
a remote node configured to encrypt a session key using the public key and to wirelessly transmit the encrypted session key;
wherein:
the host generates the public key and the corresponding private key, in response to a request for the public key from the local node,
the host sends the public key to the local node, after generating the public key and corresponding private key,
the local node sends the encrypted session key to the host,
the host decrypts the encrypted session key with the corresponding private key after receiving the encrypted session key from the local node and sends the decrypted session key to the local node, and
the local node utilizes the decrypted session key for encrypted wireless communication with the remote node, wherein the remote node comprises a wireless keyboard.

8. The system of claim 7, wherein the remote node generates the session key.

9. The system of claim 7, wherein the local node comprises a wireless transceiver.

10. The system of claim 7, wherein the local node is coupled to the host via a wired communication link.

11. The system of claim 7, wherein the local node is coupled to the host via a Universal Serial Bus.

12. The system of claim 7, wherein the local node wirelessly receives encrypted data from the remote node and decrypts the encrypted data utilizing the decrypted session key.

13. The system of claim 12, wherein the local node sends the decrypted data to the host.

14. A system comprising:
a host configured to generate a public key and a private key corresponding to the public key;
a local node coupled to the host, the local node further configured to wirelessly transmit the public key; and
a peripheral configured to wirelessly receive the public key from the local node and to encrypt a session key using the public key, the peripheral configured to wirelessly transmit the encrypted session key to the local node;
wherein:
the host generates the public key and the private key,
the host sends the public key to the local node,
the local node sends the encrypted session key to the host,
the host decrypts the encrypted session key and sends the decrypted session key to the local node, and
the local node utilizes the decrypted session key for encrypted wireless communication with the peripheral, wherein the peripheral comprises a wireless keyboard.

15. The system of claim 14, wherein the peripheral encrypts data utilizing the session key and wirelessly transmits the encrypted data.

16. The system of claim 15, wherein the local node wirelessly receives the encrypted data and decrypts the encrypted data utilizing the decrypted session key.

17. The system of claim 16, wherein the local node sends the decrypted data to the host.

18. The system of claim 14, wherein the peripheral generates the session key.

* * * * *